United States Patent
Vig et al.

(10) Patent No.: US 7,151,396 B2
(45) Date of Patent: Dec. 19, 2006

(54) CLOCK DELAY COMPENSATION CIRCUIT

(75) Inventors: Nitin Vig, Uttar Pradesh (IN); Amab K. Mitra, Uttar Pradesh (IN)

(73) Assignee: Freescale Semiconductor, Inc., Austin, TX (US)

( * ) Notice: Subject to any disclaimer, the term of this patent is extended or adjusted under 35 U.S.C. 154(b) by 46 days.

(21) Appl. No.: 11/098,106

(22) Filed: Apr. 4, 2005

(65) Prior Publication Data
US 2006/0220721 A1    Oct. 5, 2006

(51) Int. Cl.
*H03H 11/26*    (2006.01)
(52) U.S. Cl. ....................... 327/261; 327/262
(58) Field of Classification Search ........ 327/261–265, 327/268, 270, 271, 272, 273, 277–281, 283–288, 327/276
See application file for complete search history.

(56) References Cited

U.S. PATENT DOCUMENTS

| | | | |
|---|---|---|---|
| 6,262,616 B1 | 7/2001 | Srinivasan et al. | 327/264 |
| 6,529,058 B1 | 3/2003 | Gupta | 327/132 |
| 6,603,340 B1 | 8/2003 | Tachimori | 327/261 |
| 6,624,680 B1 | 9/2003 | Schenck | 327/262 |
| 6,657,473 B1 | 12/2003 | Eto | 327/261 |
| 6,664,838 B1 * | 12/2003 | Talledo | 327/277 |
| 6,664,850 B1 | 12/2003 | Roy | 330/9 |
| 6,788,123 B1 * | 9/2004 | Roy | 327/261 |

* cited by examiner

*Primary Examiner*—Linh My Nguyen
(74) *Attorney, Agent, or Firm*—Charles Bergere

(57) ABSTRACT

A clock delay compensation circuit for an integrated circuit having a first voltage domain and a second voltage domain, has a first delay element that receives a clock signal and generates a first delayed clock signal, and a multiplexer that receives the clock signal and the first delayed clock signal and generates a variable clock signal. The first delayed clock signal is selected when the second voltage domain is at a higher voltage level than the first voltage domain.

18 Claims, 2 Drawing Sheets

CLOCK DELAY COMPENSATION CIRCUIT

BACKGROUND OF THE INVENTION

The present invention relates to integrated circuits and, more particularly, to a clock delay compensation circuit for an integrated circuit having two or more voltage domains.

High performance integrated circuits, such as sub-100 nm ASICs (Application Specific Integrated Circuits) for portable, wireless applications employ complex techniques to extract maximum performance out of the ASICs. In addition to the requirement for high performance, there is a requirement for very low power consumption. One technique to achieve low power consumption is to use multiple voltage domains within a single integrated circuit (IC), where each voltage domain is served by independent power supplies, which enable applications to vary the supply in order to maximize power savings without affecting performance. These multiple voltage domain systems also have to overcome any effects caused by voltage transitions.

Since the different domains are served by independent power supplies that can also change, it is normal to expect that at any point in time the different domains may be at different operational voltages. This poses a significant challenge to designers to achieve clock balancing across the multiple domains because the moment the voltage of a domain is changed, the associated delays in the clock path also change. Such clock skew can cause operational errors.

Accordingly, there is a need for a clock delay compensation circuit for high performance ICs that have multiple voltage domains.

BRIEF DESCRIPTION OF THE DRAWINGS

The following detailed description of preferred embodiments of the invention will be better understood when read in conjunction with the appended drawings. The present invention is illustrated by way of example and not limited by the accompanying figures, in which like references indicate similar elements.

DETAILED DESCRIPTION OF THE INVENTION

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the spirit and scope of the invention.

The present invention provides a clock delay compensation circuit for an integrated circuit having at least a first voltage domain and a second voltage domain. The clock delay compensation circuit includes a first delay element that receives a clock signal and generates a first delayed clock signal, and a multiplexer that receives the clock signal and the first delayed clock signal and generates a delay compensated clock signal. The first delayed clock signal is selected when the second voltage domain is at a higher voltage level than the first voltage domain.

In one embodiment of the invention, first voltage domain is a substantially constant voltage domain and the second voltage domain is a variable voltage domain. The clock input signal is a substantially constant clock signal that is transmitted from the first voltage domain to the second voltage domain.

In another embodiment, the clock delay compensation circuit includes a plurality of delay elements connected in series, wherein an output of each of the delay elements is input to a next delay element in the series and to the multiplexer. The number of multiplexer inputs is equal to the number of delay elements plus one. As a voltage level of the variable voltage domain increases, an increasingly delayed clock signal is selected.

Figure 1:
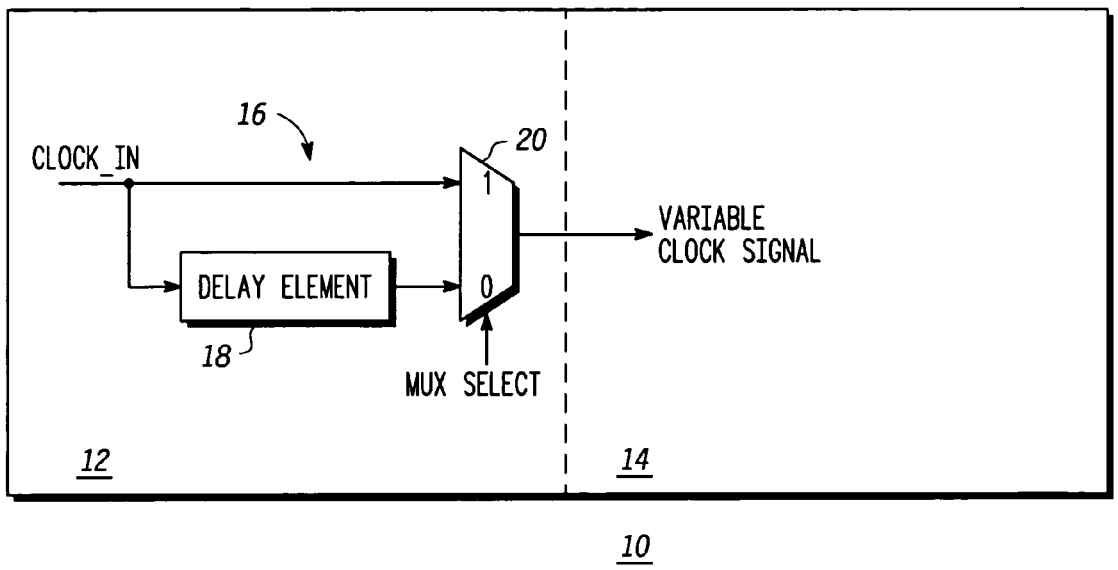
FIG. 1 is a schematic block diagram of an integrated circuit in accordance with the present invention having two voltage domains.

Referring now to FIG. 1, a schematic block diagram of an integrated circuit 10 having multiple voltage domains is shown. In the embodiment shown, the integrated circuit 10 includes two voltage domains, a constant voltage domain 12 and a variable voltage domain 14. For the constant voltage domain 12, a voltage regulator provides a substantially constant operating voltage, while for the variable voltage domain 14, a variable regulator provides an operating voltage that can be changed, such as via software. For example, the constant voltage domain 12 could operate at 1.2v and the variable voltage domain 14 could operate at 1.2v to 1.4v. As is understood by those of skill in the art, as the voltage in the variable voltage domain 14 changes from 1.2v to 1.4v, it takes a finite amount of time (Tramp) before the voltage stabilizes at the new, higher voltage, 1.4v (Vstab).

Figure 2:
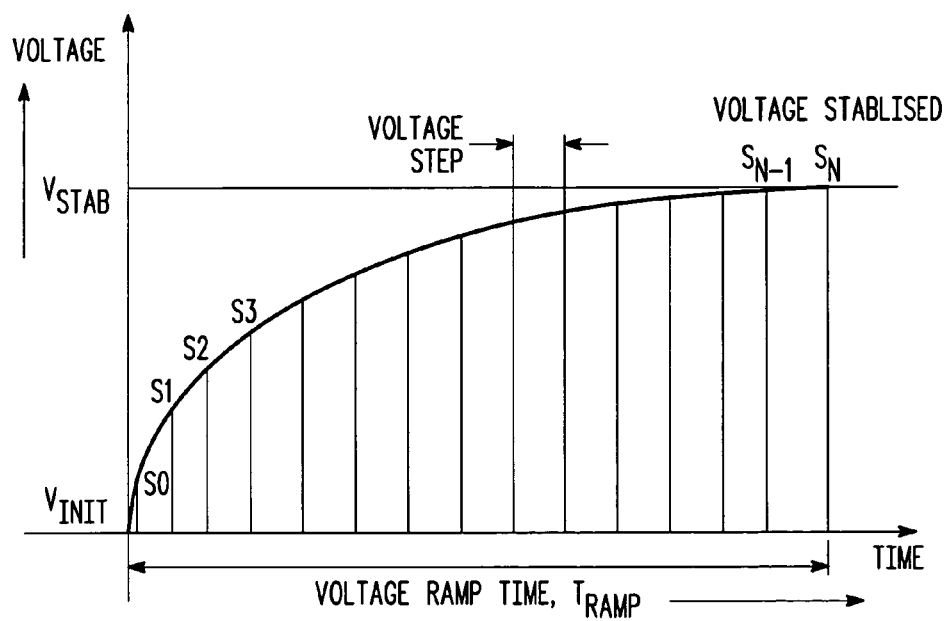
FIG. 2 is a graph illustrating the voltage ramp time of a voltage regulator.

FIG. 2 illustrates a voltage changing over time from an initial voltage, Vinit, to a stable voltage, Vstab. There are a number of voltage steps, labeled S0 to Sn, during the voltage transition. During this finite amount of time, there is a continuous change in the delay of the clock signal along the clock path that needs to be accounted for, during clock balancing, in order to prevent the occurrences of setup and hold violations in the variable and constant voltage domains respectively.

One way to handle the variable clock delays during voltage transitions is to simply stop all of the clocks to the system. While effective, this technique would adversely affect the performance of the circuit every time the voltage of a domain is changed. Yet another way to accommodate the variable clock delays during voltage transitions is to eliminate a large clock tree inside the variable voltage domain by physically placing all of the buffers on the clock path. However, it would be difficult to maintain low clock skew for such paths.

Referring again to FIG. 1, in accordance with the present invention, the clock balancing problem is addressed by modeling the voltage regulator characteristics along the clock path with a variable delay circuit 16. The variable delay circuit 16 is located in the clock path in the constant voltage domain 12. A clock signal clock_in going from the constant voltage domain 12 to the variable voltage domain 14 passes through the variable delay circuit 16. Preferably, the clock input signal is a substantially constant clock signal. The variable delay circuit 16 includes a delay element 18 and a multiplexer 20. The multiplexer 20 selects between the clock_in signal and the delayed clock signal and outputs a variable clock signal. The variable clock signal compensates for the differences in cell delays across the two voltage domains 12 and 14. The delayed clock signal is selected when the variable voltage domain 14 is at a higher voltage level than the constant voltage domain 12. Thus, as the cell delays in the higher voltage domain 14 are less than the cell delays in the lower voltage domain 12, the variable delay circuit 16 compensates for the reduced delay in the clock path by inserting an additional delay into the clock signal.

The multiplexer 20 receives a mux select signal, which may be programmable, such that whenever the voltage of the variable voltage domain 14 is changed, the mux select signal is changed. For example, to go from low to high voltage in the variable voltage domain 14, a software bit is written with a predetermined logic value to select the delayed clock signal path.

Figure 3:
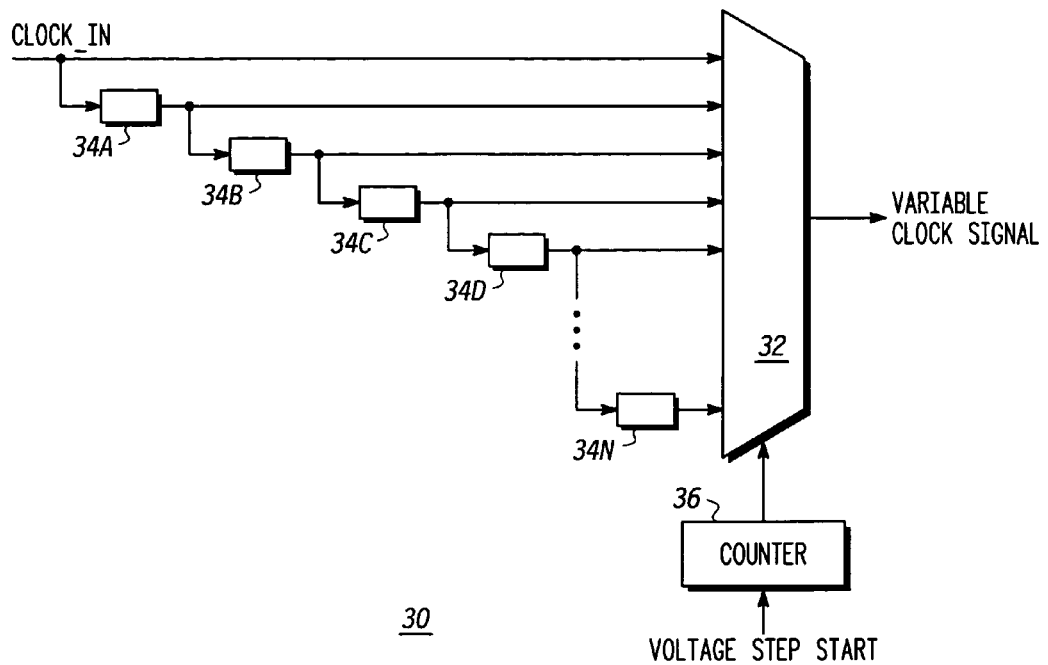
FIG. 3 is a schematic circuit diagram of a clock delay compensation circuit in accordance with an embodiment of the present invention.

FIG. 3 is schematic block diagram of another embodiment of a clock delay compensation circuit 30 in accordance with the present invention. The clock delay compensation circuit 30, like the clock delay compensation circuit 16, preferably is located in a constant voltage domain and provides a clock signal to a variable voltage domain. The clock delay compensation circuit 30 includes a multiplexer 32 and a plurality of delay elements 34a to 34n. Thus, instead of one delay element, the clock delay compensation circuit 30 includes multiple delay elements. Preferably, the delay elements 34a to 34n each provide a fixed delay time. In one embodiment the delay elements comprise buffer elements.

The number of delay elements n compares with the number of voltage steps measured and shown in FIG. 2, i.e., S0 to Sn, which shows the voltage increasing in a number of steps, marked as S0 to Sn. Since the output of the voltage regulator increments in steps, for every voltage step, a corresponding cell delay is determined. Initially the regulator output is at Vinit. Once the voltage starts to change, the next step or voltage level is S0. At this step, the corresponding cell delays are determined. The new cell delays are lower than those at Vinit as the voltage at S0 is greater than the voltage at Vinit. The difference in the cell delays at Vinit and S0 is the additional delay that is introduced into the clock path at S0 by delay element 34a. Similar delay differentials are calculated at each voltage step S0 to Sn and the calculated value is used as the delay that is introduced in the clock path via the delay elements 34a to 34n.

A counter 36 generates a mux select signal that is provided to the multiplexer 32. The counter 36 starts counting when it receives a voltage step start signal that indicates the voltage in the variable voltage domain is changing. The counter 36 counts the number of voltage steps that the voltage regulator goes through before a stable voltage is attained. The counter 36 preferably receives a clock signal that has a frequency corresponding to the rate at which the output of the voltage regulator changes.

One way of calculating a value of 'n' follows. First, the difference in a typical clock path delay across the two voltages (VL and VH) is determined (td). Then, how much clock uncertainty the design can be over constraint due to voltage variation is determined (tu). A good value of n=td/tu, which may be rounded off to the next integer. If a clock tree is balanced at 2 ns inside the variable domain at VL, and it gets 1 ns in VH, then a typical value of tu would be 50 ps, so, n=20. To determine the clock frequency for the counter 36, the number 'n' is divided by the voltage ramp up time (Tramp). A typical value for Tramp is 100 us, so the minimum clock frequency framp=n/Tramp=td/(Tramp*tu). A typical clock frequency value is (20×106)/(100×103)=200 KHz, which can be easily attained using either an already existing external clock or an internal PLL.

Figure 4:
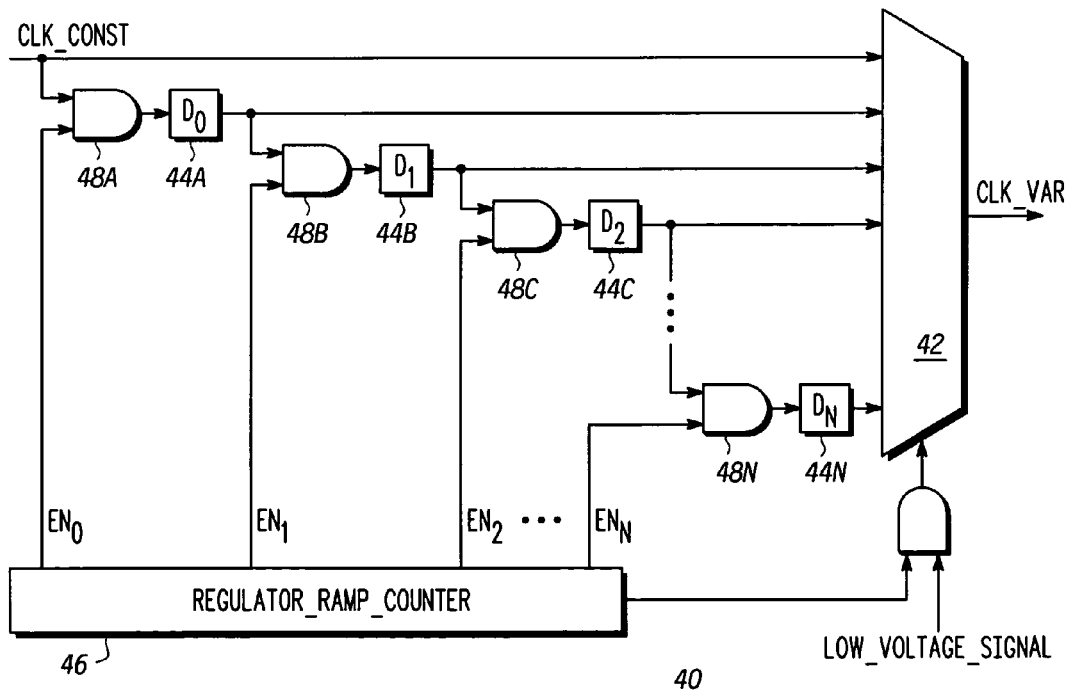
FIG. 4 is a schematic circuit diagram of a clock delay compensation circuit in accordance with a further embodiment of the present invention.

Referring now to FIG. 4, a schematic circuit diagram of a clock delay compensation circuit 40 in accordance with a further embodiment of the present invention is shown. The clock delay compensation circuit 40, like the circuit 30, includes a multiplexer 42, a plurality of delay elements 44a to 44n, and a counter 46. However, the clock delay compensation circuit 40 also includes a plurality of AND gates 48a to 48n. Each of the AND gates 48a to 48n receives a respective one of the delayed clock signals and an enable signal generated by the counter and the output of the AND gates 48a to 48n are provided to respective ones of the delay elements 44a to 44n. For example, delay element 44a receives an input from the AND gate 48a, and the inputs to the AND gate 48a are the clock_in signal and enable0 from the counter 46. Similarly, delay element 44b receives an input from the AND gate 48b, and the inputs to the AND gate 48b are the first delayed clock signal from delay element 44a and en1 from the counter 46. By providing AND gates and enable signals, the power consumed by the clock circuit 40 is reduced as compared to that consumed by the clock circuit 30.

The clock delay compensation circuit of the present invention has many advantages. The clock delay compensation circuit is simple in design and has a small number of transistor components. Consequently, the circuit area required by the clock delay compensation circuit is quite small. Further, the power requirement of the clock delay compensation circuit is quite low. The circuit can be easily synthesized and provides a complete solution at the RTL level instead of at the transistor level.

While a preferred embodiment of the invention has been illustrated and described, it will be clear that the invention is not limited to such embodiment. Numerous modifications, changes, variations, substitutions and equivalents will be apparent to those skilled in the art without departing from the spirit and scope of the invention as described in the claims.

The invention claimed is:

1. A clock delay compensation circuit for an integrated circuit having at least a first voltage domain and a second voltage domain, the clock delay compensation circuit comprising:
    a first delay element that receives a clock signal and generates a first delayed clock signal; and
    a multiplexer that receives the clock signal and the first delayed clock signal and generates a variable clock signal, wherein the first delayed clock signal is selected when the second voltage domain is at a higher voltage level than the first voltage domain, wherein a multiplexer select signal, which is input to the multiplexer to select between the clock signal and the first delayed clock signal, includes a regulator ramp counter signal.

2. The clock delay compensation circuit of claim 1, wherein the first voltage domain comprises a substantially constant voltage domain.

3. The clock delay compensation circuit of claim 2, wherein the second voltage domain comprises a variable voltage domain.

4. The clock delay compensation circuit of claim 3, wherein the voltage of the second voltage domain is alterable via software.

5. The clock delay compensation circuit of claim 3, wherein the clock input signal is a substantially constant clock signal for a given frequency.

6. The clock delay compensation circuit of claim 5, wherein the substantially constant clock signal is transmitted from the first voltage domain to the second voltage domain.

7. The clock delay compensation circuit of claim 6, further comprising:
a plurality of second delay elements connected in series, wherein an output of each of the second delay elements is input to a next delay element in the series and to the multiplexer.

8. The clock delay compensation circuit of claim 7, wherein the number of multiplexer inputs is equal to the number of first and second delay elements plus one.

9. The clock delay compensation circuit of claim 7, wherein as a voltage level of the variable voltage domain increases, an increasingly delayed clock signal is selected.

10. The clock delay compensation circuit of claim 1, further comprising:
a counter that counts a number of voltage steps that a voltage regulator encounters before stabilizing.

11. The clock delay compensation circuit of claim 10, wherein the counter has a clock with a frequency corresponding to a rate at which the output of the voltage regulator changes.

12. The clock delay compensation circuit of claim 1, wherein the delay element comprises at least one buffer.

13. A clock delay compensation circuit for an integrated circuit having a first, constant voltage domain and a second, variable voltage domain, wherein the first voltage domain operates in accordance with a substantially constant clock signal and the second voltage domain operates in accordance with a variable clock signal, the clock delay compensation circuit comprising:
a first delay element that receives the substantially constant clock signal and generates a first delayed clock signal; and
a multiplexer that receives the substantially constant clock signal and the first delayed clock signal and generates the variable clock signal, wherein the first delayed clock signal is selected when the second voltage domain is at a higher voltage level than the first voltage domain, and wherein a multiplexer select signal, which is input to the multiplexer to select between the clock signal, and the first delayed clock signal, includes a regulator ramp counter signal.

14. The clock delay compensation circuit of claim 13, further comprising:
a plurality of second delay elements connected in series, wherein an output of each of the second delay elements is input to a next delay element in the series and to the multiplexer.

15. The clock delay compensation circuit of claim 14, wherein as the voltage level of the variable voltage domain increases, an increasingly delayed clock signal is selected.

16. The clock delay compensation circuit of claim 13, further comprising:
a counter for generating the regulator ramp counter signal that counts a number of voltage steps that a voltage regulator encounters before stabilizing.

17. The clock delay compensation circuit of claim 16, wherein the counter has a clock with a frequency corresponding to a rate at which the output of the voltage regulator changes.

18. The clock delay compensation circuit of claim 13, wherein the delay element comprises at least one buffer element.

* * * * *